United States Patent
Schaafsma et al.

(10) Patent No.: US 11,126,091 B2
(45) Date of Patent: Sep. 21, 2021

(54) MEASUREMENT APPARATUS AND METHOD FOR PREDICTING ABERRATIONS IN A PROJECTION SYSTEM

(71) Applicant: ASML Netherlands B.V., Veldhoven (NL)

(72) Inventors: Martijn Cornelis Schaafsma, Eindhoven (NL); Mhamed Akhssay, Helmond (NL); James Robert Downes, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/969,078

(22) PCT Filed: Jan. 28, 2019

(86) PCT No.: PCT/EP2019/051946
§ 371 (c)(1),
(2) Date: Aug. 11, 2020

(87) PCT Pub. No.: WO2019/166163
PCT Pub. Date: Sep. 6, 2019

(65) Prior Publication Data
US 2021/0033979 A1 Feb. 4, 2021

(30) Foreign Application Priority Data
Feb. 27, 2018 (EP) ..................... 18158900

(51) Int. Cl.
G03B 27/54 (2006.01)
G03F 7/20 (2006.01)

(52) U.S. Cl.
CPC .............. *G03F 7/706* (2013.01); *G03F 7/705* (2013.01)

(58) Field of Classification Search
CPC ....... G03F 7/705; G03F 7/706; G03F 7/70891
See application file for complete search history.

(56) References Cited

U.S. PATENT DOCUMENTS 6,952,253 B2 10/2005 Lof et al.
2002/0036758 A1 3/2002 de Mol et al.
(Continued)

FOREIGN PATENT DOCUMENTS

| CN | 107121893 B | 9/2017 |
|---|---|---|
| WO | WO 2014/012643 A2 | 1/2014 |
| WO | WO 2016/087388 A1 | 6/2016 |

OTHER PUBLICATIONS

International Search Report and Written Opinion of the International Searching Authority directed to related International Patent Application No. PCT/EP2019/051946, dated May 13, 2019; 9 pages.

(Continued)

*Primary Examiner* — Peter B Kim
(74) *Attorney, Agent, or Firm* — Sterne, Kessler, Goldstein & Fox P.L.L.C.

(57) ABSTRACT

A method of calibrating a projection system heating model to predict an aberration in a projection system in a lithographic apparatus, the method comprising passing exposure radiation through a projection system to expose one or more exposure fields on a substrate provided on a substrate table, making measurements of the aberration in the projection system caused by the exposure radiation, wherein the time period between measurements is less than the time period that would be taken to expose all exposure fields on the substrate.

15 Claims, 7 Drawing Sheets

(56) References Cited

U.S. PATENT DOCUMENTS

| | | |
|---|---|---|
| 2004/0090606 A1* | 5/2004 | Ishikawa .............. G03F 7/706 |
| | | 355/53 |
| 2006/0114437 A1 | 6/2006 | Akhssay et al. |
| 2010/0171939 A1 | 7/2010 | Baselmans et al. |
| 2013/0235361 A1 | 9/2013 | Baselmans et al. |
| 2014/0204353 A1 | 7/2014 | Ozawa |
| 2017/0357159 A1 | 12/2017 | Kant et al. |

OTHER PUBLICATIONS

International Preliminary Report on Patentability directed to related International Patent Application No. PCT/EP2019/051946, dated Aug. 27, 2020; 7 pages.

* cited by examiner

MEASUREMENT APPARATUS AND METHOD FOR PREDICTING ABERRATIONS IN A PROJECTION SYSTEM

CROSS-REFERENCE TO RELATED APPLICATIONS

This application claims priority of EP application 18158900.3 which was filed on 27 Feb. 2018 and which is incorporated herein in its entirety by reference.

FIELD

The present invention relates to a measurement apparatus and method for calibrating a projection system heating model to predict aberrations in a projection system.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

The projection system which is used to image the pattern onto the substrate will induce some aberrations in the wavefront of the projected image.

It is an object of the invention to provide a method for predicting and modelling aberrations which obviates or mitigates one or more problems associated with the prior art.

SUMMARY

According to a first aspect of the invention there is provided a method of calibrating a projection system heating model to predict an aberration in a projection system in a lithographic apparatus, the method comprising passing exposure radiation through a projection system to expose one or more exposure fields on a substrate provided on a substrate table; and making measurements of the aberration in the projection system caused by the exposure radiation; wherein the time period between measurements is less than the time period that would be taken to expose all exposure fields on the substrate.

The time period between successive measurements of the aberrations may be 10 seconds or less.

The method may further comprise measuring the aberration prior to the substrate being exposed in the lithographic apparatus.

The method may further comprise measuring the aberration associated with the exposure of the exposure field; passing exposure radiation through the projection system to expose another exposure field of the substrate; and measuring the aberration associated with the exposure of the another exposure field.

The method may further comprise measuring the aberration at least once for each of a plurality of exposures of different exposure fields of the substrate on the substrate table.

The method may further comprise measuring the aberration with the substrate located on the substrate table during a cooling down phase with no exposure radiation passing through the projection system.

The method may further comprise measuring the aberration a plurality of times during the cooling phase.

The time period between successive measurements of the aberrations during the cooling phase may be less than the time period between successive measurements of the aberrations during exposure of the substrate.

The method may further comprise measuring the aberration prior to passing the exposure radiation through the projection system and measuring the aberration after passing the exposure radiation through the projection system.

The method may further comprise maintaining the size of the numerical aperture (NA) for the projection system between measurements of the aberration during exposure of the substrate.

The method may further comprise maintaining the size of the numerical aperture (NA) for the projection system at less than the full NA during the exposure of the substrate and the cooling phase.

The method may further comprise measuring the aberration associated with the exposure of a plurality of substrates on a plurality of substrate tables.

The method may further comprise providing temporal modulation of a source producing the radiation beam.

The method may further comprise providing amplitude modulation of a source producing the radiation beam.

According to a second aspect of the present invention there is provided a measurement apparatus configured to make measurements for calibrating a projection system heating model to predict an aberration in a projection system in a lithographic apparatus; wherein the measurement apparatus is configured to make measurements of the aberration in a projection system caused by exposure radiation being passed through the projection system to expose one or more exposure fields on a substrate on a substrate table; and wherein the measurement apparatus is configured to make the measurements in a time period that is less than the time period that would be taken to expose all exposure fields on the substrate.

The time period between successive measurements of the aberrations may be 10 seconds or less.

The measurement apparatus may be configured to measure the aberration prior to the substrate being exposed in the lithographic apparatus.

The measurement apparatus may be configured to measure the aberration associated with the exposure of the exposure field, and then measure the aberration associated with the exposure of another exposure field of the substrate after exposure radiation has passed through the projection system to expose the another exposure field of the substrate.

The measurement apparatus may be configured to measure the aberration at least once for each of a plurality of exposures of different exposure fields of the substrate on the substrate table.

The measurement apparatus may be configured to measure the aberration with the substrate located on the substrate table during a cooling down phase with no exposure radiation passing through the projection system.

The measurement apparatus may be configured to measure the aberration a plurality of times during the cooling phase with the substrate.

The time period between successive measurements of the aberrations during the cooling phase may be less than the time period between successive measurements of the aberrations during exposure of the substrate.

The measurement apparatus may be configured to measure the aberration prior to the exposure radiation being passed through the projection system and measure the aberration after the exposure radiation has been passed through the projection system.

The measurement apparatus may be configured to measure the aberration associated with the exposure of a plurality of substrates on a plurality of substrate tables.

The radiation may be amplitude modulated.

The radiation may be temporal modulated.

According to a third aspect of the invention there is provided a lithographic apparatus comprising a projection system configured to project a pattern from a mask onto a substrate, the lithographic apparatus further comprising the measurement apparatus described above.

The size of the numerical aperture (NA) for the projection system may be maintained between measurements of the aberration during exposure of the substrate.

The size of the numerical aperture (NA) for the projection system may be maintained at less than the full NA during the exposure of the substrate and the cooling phase.

The size of the numerical aperture (NA) for the projection system may be changed from less than full NA for the exposure to full NA for the measurement and then back to less than full NA for another exposure.

According to a fourth aspect of the invention there is provided a computer program comprising computer readable instructions configured to cause a processor to carry out a method as described above.

According to a fifth aspect of the invention there is provided a computer readable medium carrying a computer program as described above.

According to a sixth aspect of the invention there is provided a computer apparatus for calibrating a projection system heating model to predict an aberration in a projection system in a lithographic apparatus comprising: a memory storing processor readable instructions; and a processor arranged to read and execute instructions stored in said memory; wherein said processor readable instructions comprise instructions arranged to control the computer to carry out a method as described above.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
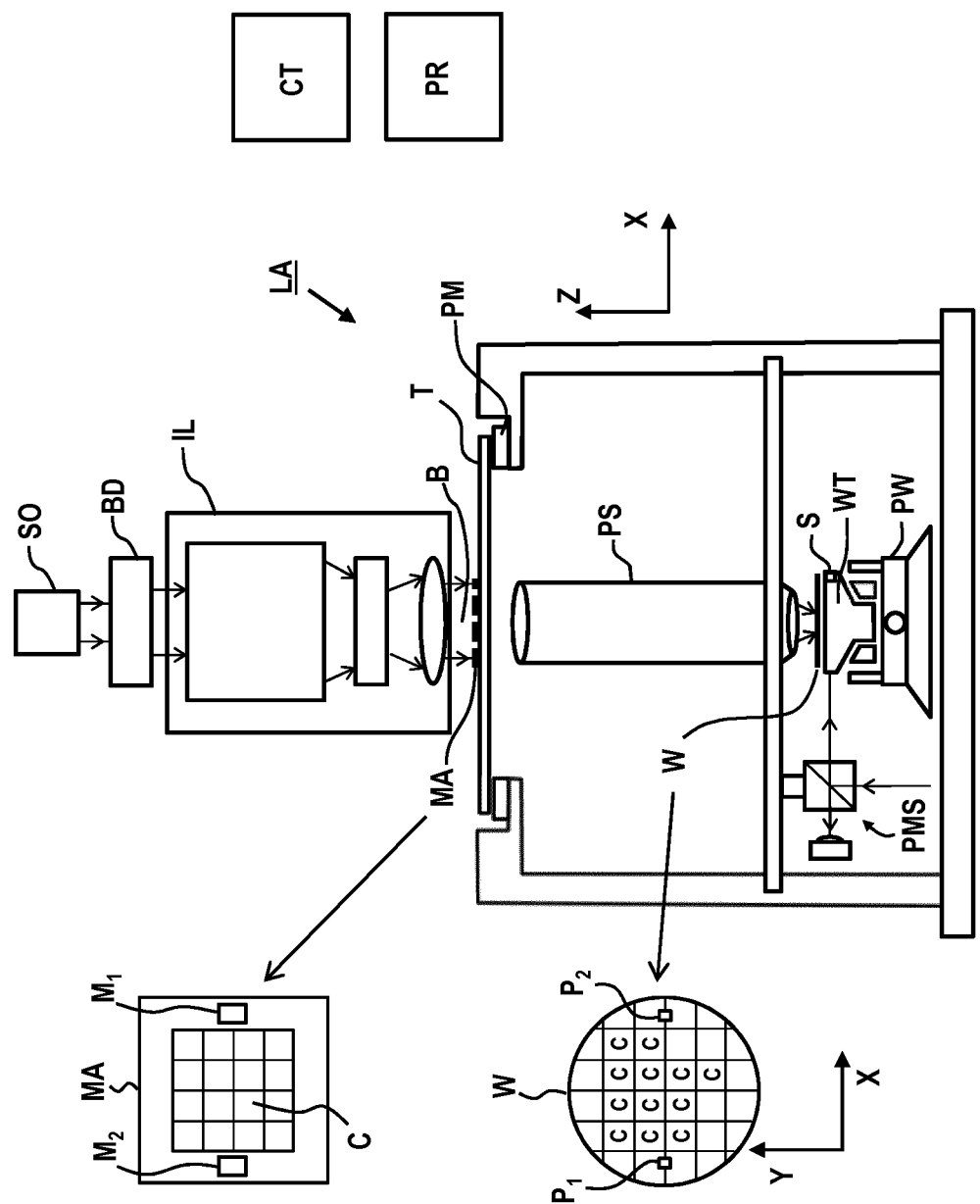
FIG. 1 depicts a schematic overview of a lithographic apparatus according to an embodiment of the invention.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system PS, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axes. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

A sensor S is provided at the substrate table WT of the lithographic apparatus. The sensor S is configured to measure an aberration in the radiation beam projected by the projection lens (which may also be referred to as the projection system PS). The sensor S may for example comprise an imaging array (e.g., a CCD or a CMOS array) located a few millimeters below a diffraction grating (e.g., comprising several hundred lines). An object marker (not shown) which may for example consist of a few lines printed within a pinhole is provided either on the mask MA or on the mask table MT.

In order to perform a measurement of the aberration caused by the projection system PS, the mask table MT is moved such that the radiation beam B illuminates the object marker. The projection system PS forms an image of the object marker at the substrate table WT. The sensor S is positioned beneath the projection system PS to capture the far field image of the object marker. A series of object marker images are captured at different positions relative to the XY plane (i.e., different xy-direction positions using the Cartesian coordinates shown in FIG. 1). The images are analysed by a processor PR to provide measurements of the aberration which have been introduced into the radiation beam B by the projection system PS.

The aberration may for example be expressed as a set of Zernike polynomials. For example, Zernike coefficients $Z_2$ to $Z_{25}$ of the field orders offset, tilt, curvature and third order may be used to express the aberrations. Thus, a description of the state of the projection system PS may have 96 coefficients (24×4). In other examples, other ranges of Zernike coefficients may be used. For example Zernike coefficients up to $Z_{64}$ may be used, or Zernike coefficients up to $Z_{100}$ may be used. In other examples, the aberrations may be measured in another way using a different type of sensor. For example, for a limited set of aberrations dX, dY, dZ, we can also measure the peak light intensity in order to determine a position, for example by means of a transmissive image sensor.

A set of measurements may be performed with the object marker and sensor S at different x-direction positions along an area which is illuminated by the radiation beam B (the illuminated area may be referred to an exposure slit). Alternatively, the sensor S may comprise an imaging array (e.g., a CCD or a CMOS array) which is sufficiently large to capture an image along the entire x-direction extent of the exposure slit. Where this is the case a set of object markers may be provided at mask level, the object markers being spaced apart along the x-direction of the exposure slit. Aberration measurements are then determined for each object marker of the set. In an embodiment the set of object markers may comprise seven object markers, and thus aberration measurements may be provided at seven positions spaced apart along the x-direction of the exposure slit. In some instances images may be captured away from a central line which bisects the exposure slit (which may correspond with y=0) and are used to provide aberration measurements. In other examples, there may be a different number of object markers. In other examples, the object markers may not all be aligned in the x-direction.

A controller CT is configured to adjust lenses of the projection system PS in order to correct the aberrations caused by the projection system PS. Several of the lenses of the projection system PS may be provided with manipulators which are configured to modify the shape, position and/or orientation of those lenses. The lens manipulators may for example be mechanical actuators which apply compressive or stretching force to edges of a lens, or may for example be heaters coolers which are configured to selectively heat or cool parts of a lens, respectively. The effect of modifying the lens shapes, positions and orientations using the manipulators is well-known and thus the lens manipulators can be used to correct the aberration introduced by the projection system PS in a known way. The lens adjustments and the aberrations may be considered to have a linear relationship. The sensor S, processor PR, controller CT and lens manipulators thus comprise a feedback loop, which is used to measure aberrations and to correct measured aberrations. In one example, the sensor S and controller CT determine that a $Z_9$ offset is present. This may be reduced by introducing a linear combination of manipulator adjustments, which introduce the opposite $Z_9$ offset. The linear combination of manipulator adjustments is determined by optimizing a merit function (typically a sum of squares of the measured aberrations) by treating the various lens manipulators as the degrees of freedom. If a is a vector containing all manipulator positions and z is a vector containing all the aberrations measured at the different positions in the exposure slit, then the aberrations resulting after a lens adjustment will be $z'=z-L \cdot a$ where L is a matrix containing the 'lens dependencies'. The lens dependencies being a description of the aberrations introduced by each manipulator. A simple example of a solution is the least-squares solution, where z' is minimized treating the vector a as the variable parameter set, giving $a\_min=(L \cdot L^{\wedge}T)^{\wedge}(-1) \cdot L^{\wedge}T \cdot z$. Solutions other than a least-squares solution may be used.

The feedback loop may thus be used to correct aberrations introduced by the projection system PS. It may not be possible to entirely remove all aberrations introduced by the projection system PS. However, reduction of the aberrations such that they fall below thresholds may be sufficient to allow projection of a pattern onto substrates with a desired accuracy using the projection system PS. References to correction of aberrations is not intended to mean that aberrations are entirely eliminated (this would be impractical). Instead, aberration correction may be interpreted as meaning a projection lens adjustment, which reduces (or is intended to reduce) aberrations caused by the projection lens.

As mentioned, the projection system PS, which is used to image the pattern onto the substrate, will induce some aberrations in the projected image. The aberrations may be due to different properties or settings of the projection system PS, which may be considered as falling into two groups. The first group relates to the environment of the projection lens, which may include the temperature of the projection lens, the pressure in the projection lens, the differential pressure at different locations in the projection lens, and the cooling water temperature. The second group relates to the radiation, which is being projected by the projection lens and may be considered as exposure settings. The second group may include the illumination mode of the radiation beam, e.g., including the polarization mode, properties of the mask, such as the identity of the mask, diffraction patterns present on the mask and the transmission of the mask, reflection of radiation from the substrate W, and the width of the mask region being illuminated.

The optical properties of the projection system PS depend on the heat distribution in the projection lens elements. When the light passes through the lens, a fraction of this light is absorbed and the absorption induces local heating. Heat diffusion and convection, as well as the temporal modulation of the light source, make the heat distribution dynamic and time-dependent. The local heating changes the local optical properties of the projection system PS, and thus the overall optical properties of the projection system PS are time-dependent, resulting in distortions of the wave-front. As mentioned, these are aberrations, which may be expressed by Zernike polynomials.

At least a part of the aberrations may be induced by the projection system PS. It will be appreciated that the mask or distortions of the mask may induce another part of the aberrations in the projected image. The part of the aberration that is induced by the projection system PS may be described by modelling lens heating. The part of the aberrations that may be described by modelling lens heating may be caused by heat being delivered to the projection system PS, for example during exposure of one or more lots of substrates. For example, a part of the aberrations may be caused by thermal expansion of the projection lens, thermal expansion of a coating of the projection lens and/or changes of one or more properties of the projection lens, such as for example a refractive index of the projection lens. A lens heating model may model a response of the projection system PS to heat being delivered to the projection system PS, for example during exposure of one or more lots of substrates. The modelling of lens heating may include the use of a system identification method, which is based on measurements of the true system, e.g., the lithographic apparatus LA.

The lens heating model may include the use of the system identification method, which is based on measurements of the lithographic apparatus, e.g., the projection system PS. The measurements of lithographic apparatus may be performed during calibration of the lithographic apparatus, e.g., when the exposure of production of substrates is interrupted. The quality/accuracy of the lens heating model depends on measurement data that may be collected during calibration of the lithographic apparatus. Such measurement data may include aberration measurements, for example performed by the sensor S, which are stored with corresponding exposure settings, illumination modes of the radiation beam and/or properties of the mask. The lens-heating behaviour may be well described by a small number (e.g., 2 to 3) of exponentials, which describe the time-dependent nature for each individual Zernike and field order. That is, there is a small number of different exponentials for each different Zernike.

For an accurate lens heating model, calibration of the lens heating model may be necessary. For example, a calibration may be used for each exposure setting, e.g., illumination mode or different properties of the mask. For such a calibration, a dedicated measurement sequence may be used to collect data, which may be used for the calibration of the lens heating model. This may impact the availability of the lithographic apparatus LA for commercial production. In another example, offline computational calibration of the lens heating model may be performed for each exposure setting. In such an example, the calibration measurements are generated by an offline physical model to obtain data, which may be used for the calibration of the lens heating model. By using offline computational calibration of the lens heating model, the availability of the lithographic apparatus LA for commercial production of substrates may not be affected. However, the accuracy of the lens heating model may be limited as the calibration of the lens heating model is not based on measurements of the lithographic apparatus LA. In yet another example, inline measurements during production of commercial substrates may be used to calibrate the lens heating model. Commercial substrates may be still produced in this example. However, no inline calibrated lens heating model may be available.

Figure 2:
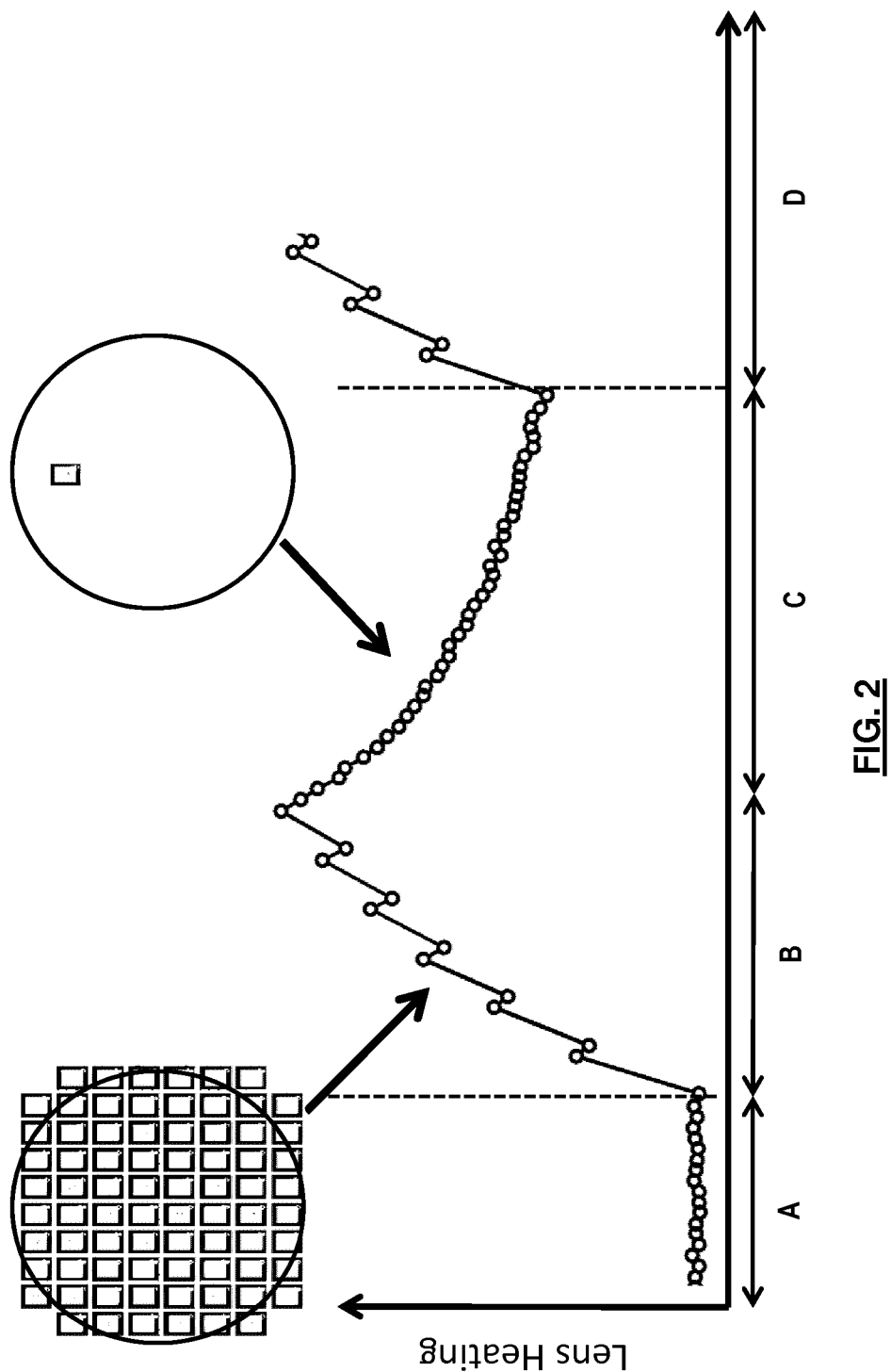
FIG. 2 depicts a diagram of calibration data acquired using a measurement procedure according to an embodiment of the invention.

FIG. 2 shows an example of calibration data that have been acquired with a measurement procedure according to an embodiment of the invention. As mentioned, calibration of a lens (projection system PS) heating model may be carried out inline or offline. In this context, inline refers to measurements in the lithographic apparatus LA that are performed when exposing production substrates and offline refers to measurements in the lithographic apparatus LA, which are performed when not exposing production substrates. In this embodiment, the calibration of the projection system PS heating model is carried out offline and the terminology of FIG. 1 will be used to describe the components used.

The sensor S may be considered to form at least part of a measurement apparatus configured to make measurements of aberrations in the projection system PS caused by exposure radiation (radiation beam B) being passed through the projection system PS to expose one or more exposure fields (target potions C) on a substrate W on a substrate table WT.

As mentioned, the heat distribution of the radiation beam B in the projection system PS is dynamic and time-dependent, and some of the projection system PS heating effects are faster than other projection system PS heating effects. That is, the fast projection system heating effects decay with time constants, which are less than other slower lens heating effects. Projection system PS heating effects may be considered to be fast if they occur in a time period, which is less than the time needed to expose two substrates during commercial production. Fast projection system PS heating effects may be considered to be those for which a large part of the effect can cool during the preparation actions between successive exposures of substrates. This means that, for a lithographic apparatus LA taking about 15-20 seconds to cycle a substrate of which 10 seconds is expose time, time constants are of the order of 5-10 seconds. These time constants have the characteristic that they are difficult to measure when placing measurements in the normal production sequence.

The graph of FIG. 2 shows projection system PS (lens) heating effects (y-axis) over a timescale (x-axis). In particular, the dots represent measurements of $Z_5$ Zernike coefficients for aberrations in the projection system PS and a line has been fitted through the measurements. The projection system PS heating effects for the last part of a cooling down phase of substrates being moved through the scanning process are shown in section A of the graph. In section A there is very little, exposure radiation passing through the projection system PS. This may be low intensity exposure radiation so that the aberration measurements can be made but will not impact the calibrated projection system PS heating (i.e. the radiation is negligible in the context of projection system PS heating). The substrates are not being exposed since there is "zero-dose" of radiation and so there are very little, if any, projection system PS heating effects measured. This may allow for dissipation of heat present in the projection system PS due to previous exposures as well as characterization of parasitic effects other than projection system PS heating.

In the next section of the graph, section B, the heating effects of the projection system PS during the exposure of a single substrate W is shown. In particular, in section B, the full substrate W is subject to a heating phase and is exposed and then this is repeated another five times. In other words, there are six repeats of the exposure of a full substrate coverage layer comprising 76 exposure fields C (in this example). The full substrate W is exposed so that there are sufficiently large heating effects in the projection system PS for measuring. Six repeats of the exposure provides that the heating effects become saturated and provide a suitable range for heating effects to be measured.

Exposure radiation is passed through the projection system PS to expose the exposure fields C of the substrate W and the aberration associated with the exposure of the exposure fields C is measured by the sensor S. Then, exposure radiation is passed through the projection system PS to expose all the exposure fields C of the substrate W again, and the aberration associated with the exposure of the exposure fields C is measured by the sensor S. This is repeated another four times. In other examples, the number of exposure fields C may be different from 76. In other examples, there may be a different number of repeat exposures of the full substrate W, for example, 1-5 or more than 6. In other examples, the full substrate W layer may not be exposed between measurements and only a part of the full substrate W layer may be exposed. For example, only half of the number of exposure fields C on the substrate W may be exposed between measurements. In other examples, only one or a few exposure fields C may be exposed during each exposure between measurements.

The aberration may be measured at least once for each of a plurality of exposures of different exposure fields C of the substrate W on the substrate table WT. More particularly, in this example, the aberration measurement ($Z_5$ measurement) is made immediately before exposure of the exposure fields C of the substrate W and immediately after exposure has occurred for each substrate W. That is, there are twelve measurements in total for all the six substrates W together. Measuring before and after the exposure effectively modulates the heat load. This results in a more accurate fit of the projection system PS heating parameters. The closer the measurements are to the exposure the better the accuracy of the fit. Although six exposures are illustrated in FIG. 2, in other examples, a different number of exposure fields C may be exposed, such as one, two, or three exposure fields C.

More generally, the time period between a first and a second measurement of aberrations in the projection system PS is less than the time period that would be taken to expose all exposure fields C of the substrate W. This allows for a more accurate detection of the projection system PS heating phenomena, as will be explained in more detail later.

In section C of the graph of FIG. 2, the substrate W is still located in an exposure position on the substrate table WT, which has not been swapped with another substrate table WT. That is, section B and C of the graph relate to measurements taken on a single substrate W provided on a single substrate table WT. Section C of the graph relates to a cooling down phase of the substrate W with no, or very little, exposure radiation passing through the projection system PS. In section C, single exposure fields are exposed with "zero dose" with a measurement made before and after each single-field exposure (which effectively amounts to two measurements in between the single-field exposures). Since the full set of measurements are carried out on a single substrate W, avoiding any substrate table WT swaps, no time is lost in swapping substrate tables WT. Furthermore, some aspects of sensor noise, which is associated with re-aligning of the new substrate table, are reduced.

In the example of FIG. 2, forty measurements are taken in the cooling phase (section C of the graph). A single exposure field C is exposed with no exposure radiation heating up the projection system PS. During the cooling phase, the single exposure field is 'exposed' with zero-dose. This means that the system goes through all the motions of exposing this exposure field but without light being transmitted through the projection system PS. This has a couple of advantages. Firstly, the duty cycle of the sensor S is limited because of the time taken to move to the substrate W region and back. Secondly, the conditions with which scans are made is equal for each 'before' scan and each 'after' scan. The direction with which the stages move towards the sensor S can (for a system with immersion fluid between stage and lens) impact the measurement results.

The same substrate table WT may be used for each measurement and there are no substrate table WT swaps between measurements. The omission of the substrate table WT swap allows the time in between measurements to be reduced. The relatively large number of measurements in the cooling phase provides good data for the projection system PS heating model for fast projection system PS heating behaviour. In other examples, a different number of measurements may be taken in the cooling phase, e.g. once, twice or three times. More generally, the aberration in the projection system PS may be measured a plurality of times during the cooling phase. The time period between successive measurements of the aberrations during the cooling phase may be less than the time period between successive measurements of the aberrations during exposure of the substrate. In other examples, the aberration may only be measured once in the cooling phase.

Section D of the graph of FIG. 2 shows a part of the result of the next substrate W of the lot being subject to a heating phase similar to section B of the graph. There will also be a cooling phase (not shown) for this substrate W. In this example, the sequence continues for eight substrates W in the lot. In other examples, there may be more or less than eight substrates W in the lot. More generally, the aberration associated with the exposure of a plurality of substrates W provided on a plurality of substrate tables WT is measured. That is, aberration measurements are made which are separated by a time period less than the time period it would take to expose all the exposure fields for a substrate W. At least one aberration measurement may be made in the heating phase and at least one aberration measurement may be made in the cooling phase for each substrate W provided on their respective substrate tables WT.

The calibration method, which provides the calibration data shown in FIG. 2, allows fast heating effects to be calibrated. In particular, projection system heating induced aberration drift which requires exponentials having time-constants lower than 20 seconds can be properly calibrated using this method. In some examples, the time period is 10 seconds between measurements of the aberrations in the heating phase, the measurements being before and after an exposure (section B of the graph of FIG. 2). In other examples, the time period between successive measurements may be below 10 seconds. The time between measurements may be as low as 2 seconds, which allows the calibration of times constants as low as 4 seconds.

Taking measurements associated with the exposure of a limited number of exposure fields C on the substrate W rather than the exposure of the full substrate W means that a higher frequency of measurements are able to be taken. Furthermore, avoiding swapping of the substrate tables WT between measurements allows quicker measurements to be taken because the time taken to swap the substrates W is avoided. Furthermore, reducing some aspects of the sensor noise associated with re-aligning of the next substrate table WT helps reduce the minimum time period between successive measurements.

Between the measurements of the aberrations associated with exposure for each exposure field (the heating phase), the numerical aperture (NA) for the projection system PS may be maintained at the same size. The size of the NA for the projection system PS may be maintained at the same size during the cooling phase. The size of the NA for the projection system PS may be maintained at the same size during the measurements for both the exposure of the substrate W (the heating phase) and the cooling phase. The size of the NA may be less than the full NA (i.e. maximum NA) of the measurement apparatus. A small pupil may be used for some or all the measurements made. It may not be necessary to image over the full pupil (full or maximum NA) to calibrate for fast heating effects as max NA may be generally be used for slow behaviour. As the calibration method of embodiments of the invention are primarily concerned with calibrating fast lens heating behaviour, imaging over the full NA may not be required. The NA of the projection system PS may have a specific size for exposure (e.g. smaller than maximum NA) and the NA may have specific size for measurement, such as maximum NA. The size of the NA may be changed from exposure NA to maximum NA for measurement and then back to exposure NA for exposure after the measurement.

As well as predicting the projection system PS heating which occurs during exposure of a given lot of substrates W, the effects of the cooling of the heated projection system PS during subsequent lots may be predicted. In order to predict the aberrations over the full pupil (i.e. at maximum NA), it is necessary to have measured the aberrations at maximum NA during the projection system PS heating calibration. The projection system PS heating is dependent on the NA at which the exposures at made. Thus, in order to measure and then predict projection system PS heating from small NA exposures for later lots being exposed at larger NAs, it is necessary to measure at maximum NA, reduce the NA to the exposure NA, expose, then adjust the NA, and then measure again. Thus, there is a time limit on how quickly a measurement at maximum NA can be carried out before or after an exposure of a wafer at small NA (e.g., ~4 seconds). Thus, in section B of the graph in FIG. 2, the exposure and the measurements for a small NA exposure will necessarily add extra time (e.g., ~8 seconds) between measurements. Whereas during section C after one switch to maximum NA, all the measurements can be carried out with no further NA change.

Switching the NA (e.g., from a small pupil to the maximum NA or vice versa) takes some time. This means that there is a delay before measurements can be made if the NA is switched between measurements. Avoiding the switching of NA between measurements allows for an increase in the speed of the measurements, i.e., the time period between successive measurements can be reduced. This becomes particular useful in section C of the graph of FIG. 2, as there is a large number of measurements in a relatively short period of time after a single NA change.

The substrate W that is being exposed for the calibration of FIG. 2 is not in production, i.e., fields that are exposed are not expected to subsequently form working integrated circuits. This means that the exposure radiation (radiation beam B) can be modified in a different way than would be possible if the substrate was in production. This is because the substrate W that is being exposed does not need to have the necessary patterns imaged on it as required if it is being used in production. The radiation beam B may be modified by inputting increased levels of radiation onto a particular area of the substrate and/or only exposing certain exposure fields of the substrate.

The amplitude of the radiation beam B may be modulated by intensity level variations of the light source production the radiation beam B. This increases the intensity of the heating effects. More particularly, the amplitude modulation increases the intensity levels of the radiation above normal exposure for production to give more heating and increased fast heating effects. This allows high frequent excitation of lens heating, combined with high frequent sampling. Further, this produces a bigger signal to noise ratio and thus improved accuracy for the calibration.

The time during which the radiation beam B is switched on and producing the heating effects in the projection system PS may be modified, i.e., temporal modulation of the light source producing the radiation beam B. This temporal modulation of the light source means that the projection system PS fast heating effects are excited more effectively and also for better fitting accuracy. Since the calibration of the projection system PS fast heating effects is particularly important in order to increase the accuracy of the projection system PS heating model, increasing the projection system PS heating effects for fast heating is beneficial for increasing the accuracy of the model. Changing the timings over the course of the calibration changes the ratio over which the heating effects are excited. This has the result that the time constants are able to be fitted in a more reliable way. Changing the timing of the radiation beam B, e.g. providing some of the heating in a shorter time period and some of the heating in longer time periods, provides more variation in the data. This leads to a broader range of time constants that can be fitted to the data and thus a better fit.

There is an issue in that the projection system PS heating measurements interrupt the exposure sequence of the substrate W. During projection system PS heating measurements the heating process is interrupted. Thus, the substrate W cannot be exposed (projection system PS heating excited) and the projection system PS heating signal sampled at the same time.

It is desirable to achieve high sampling density (in time), while exciting the projection system PS sufficiently by exposing the substrate W. Persistency of excitation is important: the projection system PS should be excited in the frequency range that is of interest. A monotonous heating input signal results in excitation of low frequency (large time constants) of projection system PS heating signal. While high frequency input signal, for example exposure of less than a full substrate W or short time between exposures due to shortened time to make measurements, excites also high lens heating frequencies (small time constants, thus fast projection system PS heating).

The temporal modulation of the radiation beam B may be achieved by only exposing a portion of the substrate W in the heating phase (section B of FIG. 2), e.g., half of the exposure fields C on the substrate W, between measurements.

Another way to achieve the temporal modulation of the radiation beam B would be to expose different numbers of substrates before taking a measurement. As an example, 3 substrates could be exposed and then a measurement taken, and then 4 substrates could be exposed and then a measurement taken, etc. Different numbers of repeated full-substrate exposures in a series of full-substrate exposures (heating phase—section C of FIG. 2) may be followed by zero-dose single-field exposures (cooling phase). This stimulates the projection system PS heating phenomena in a different way and enables easier identification of all time constants. In other examples, other methods to achieve temporal modulation of the radiation beam B may be used. For example, the substrate W could be exposed with zero dose for the time it takes to expose different numbers of substrates W.

The reduction in time period between measurements allows time constants to be fitted to the measured data which provide an improved calibration of fast projection system PS heating effects. Taking the measurements more quickly means that more measurements can be taken within a particular time period. Having more measurements means more data points and therefore better modelling of the projection system PS heating effects. Some of the advantages of the measurement procedure according to embodiments will now be illustrated by reference to a previous strategy for Lens Heating Control (LHC).

Previously, the LHC predicted aberrations in the projection system PS by calibrating an application specific lens-heating model containing exponentials describing the time-dependent nature of the individual Zernike coefficients in a similar way as described above. The aim was to calibrate and predict within-wafer drift and within-lot drift. The lens heating calibration test, that is Automated Lens Heating Calibration (ALHC), was performed during production exposures (so-called in-line calibrations). However, the measurements would occur only once (or perhaps twice) at an interval determined by the time taken to expose production wafers.

This previous strategy was unable to properly and efficiently calibrate Lens Heating-induced aberration drift which required exponentials having time constants lower than 20 seconds. This was at least partially due to the substrate W expose duration, which drives the frequency of measurement, being of the order of about 14 seconds. Furthermore, the sensors used to measure the aberrations also have an associated noise. The limited highest frequency of measurement and sensor noise combined to put a lower limit of about 20 seconds on the time constants, which could be fitted to the measured data. Additionally, the requirement to describe the lens-heating over the full lens pupil (maximum NA) for exposures using a small pupil (NA image) meant that NA switching also extended the duration of the measurements in between the substrate exposures. It has been realized that the previous LHC provided relatively poor calibration performance for an application with fast lens heating.

Figure 3:
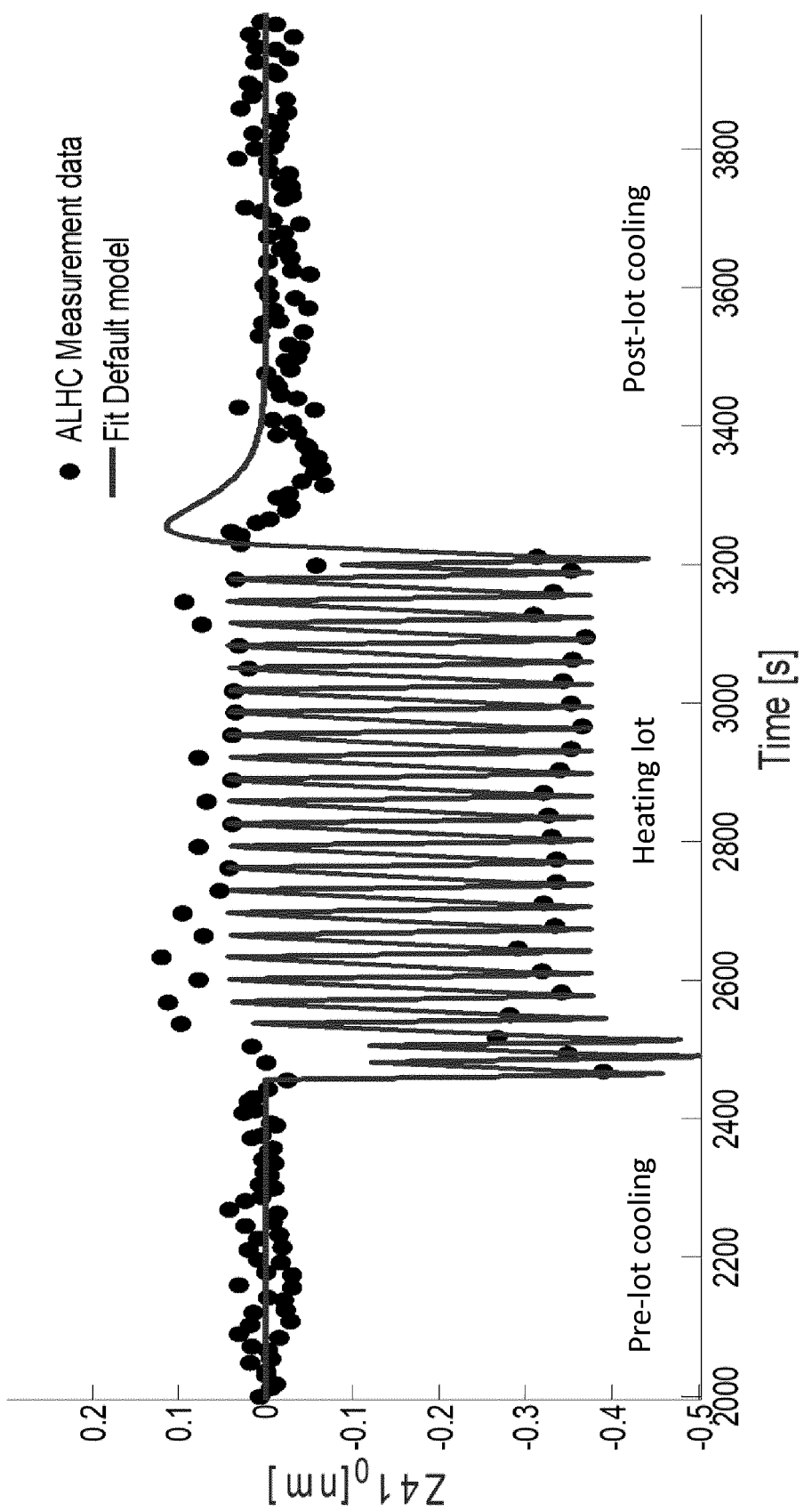
FIG. 3 depicts a diagram of previous measurement data and a previous projection system heating model curve.
Figure 3:
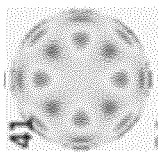

FIG. 3 shows a graph illustrating the poor calibration performance for an application with fast lens heating under the previous LHC strategy. In particular, measurements for $Z_{41}$ Zernikes over a specific timescale for exposure of a lot of 25 substrates are shown. The dots show the measurements of the aberrations for $Z_{41}$ Zernikes and the solid curve represents the default (previous) lens heating model. There is a pre-lot cooling portion, where the curve is straight at $Z_{41}$=0 nm. It can be seen that the actual measurements are clustered around the 0 nm line.

Once the exposure of the lot of substrates begins and the lens is heated (heating lot portion), the curve has peaks and troughs which model the aberrations. Each trough of the curve represents the exposure of a substrate within the lot. There are two measurements taken for each substrate exposure. Once the final substrate in the lot has been exposed, the heating of the lens is stopped and there is a post-lot cooling portion.

As can be seen from the graph in FIG. 3, there is a mismatch between the model represented by the solid curve and the actual measurements represented by the dots. This is particularly evident in the initial part of the post-lot cooling portion after the last substrate has been exposed. This is at least partially because the fast heating effects are not well modelled. This mismatch will have an impact on system performance as the corrections made for the aberrations will not be fully accurate.

Figure 4:
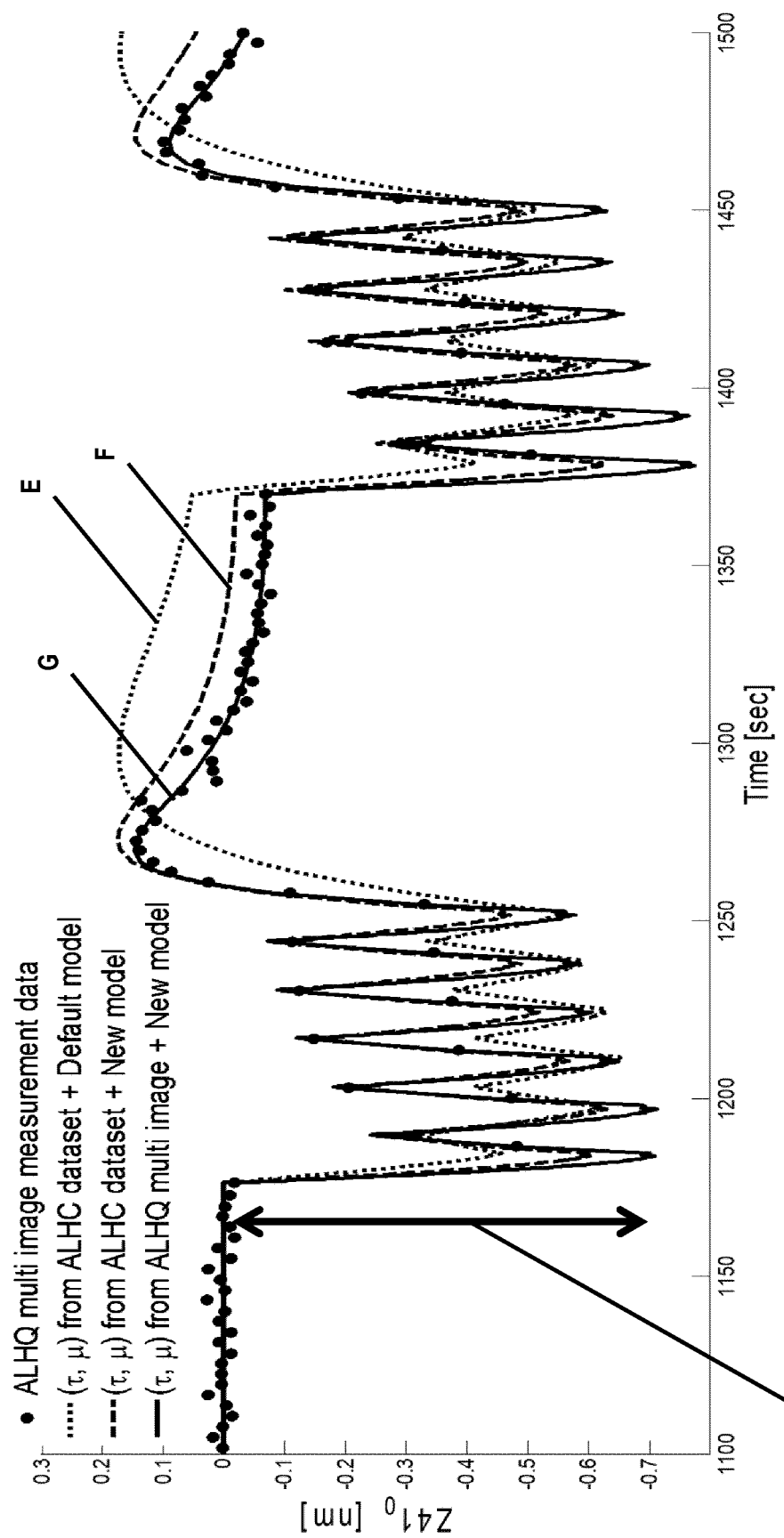
FIG. 4 depicts a diagram of calibration data and a projection system heating model curve according to an embodiment of the invention and a comparison with previous projection system heating model curves.

FIG. 4 shows an example of calibration data that has been acquired with the measurement procedure according to an embodiment of the invention and subsequent modelling. The dots represent actual projection system PS heating data ($Z_{41}$) as measured by a measurement apparatus, i.e., a sensor S.

A dotted curve E represents the previous ALHC data and the previous default model. It can be seen that the dotted curve E does not match the measurements represented by the dots well, particularly in the cooling phase. A dashed curve F represents a new calibration model but using the ALHC data. In the new calibration model exponentials with smaller time constants are permitted (compared with the default model). This provides an improvement of the modelling towards the actual measured data but there is still a mismatch, particularly for the fast cooling behaviour. The continuous solid curve G represents data from the new Automated Lens Heating Qualification (ALHQ) and the new calibration model. That is, the curve G was generated using measurements which were separated by a smaller time interval than was previously the case, and using a calibration model which permits exponentials with smaller time constants (compared with the default model).

The fast projection system PS heating effects are more accurately calibrated using the new measurement procedure and calibration model than using the previous strategy. This is evidenced by the continuous solid curve G describing both the fast and slow cooling behaviour very well as the solid curve G fits the measurement dots. In addition, the solid curve G shows that the predicted intra-wafer drift is about 30-40% larger than what is measured (see arrow H). The curve G is considered to be an accurate representation of what is actually occurring, and, as a result, curves E and F make an underprediction of the intra-wafer drift. The predicted drift (curve G) is larger than the measured drift (curves E and F) since the projection system PS cools down during the time between the last exposure and the first measurement. The new ALHQ and the new calibration model (curve G) may correctly calibrate the projection system PS heating induced aberrations over the substrate exposure. The improved knowledge of the aberrations enables the lens actuators to be used to compensate for this previously unknown drift.

Figure 5:
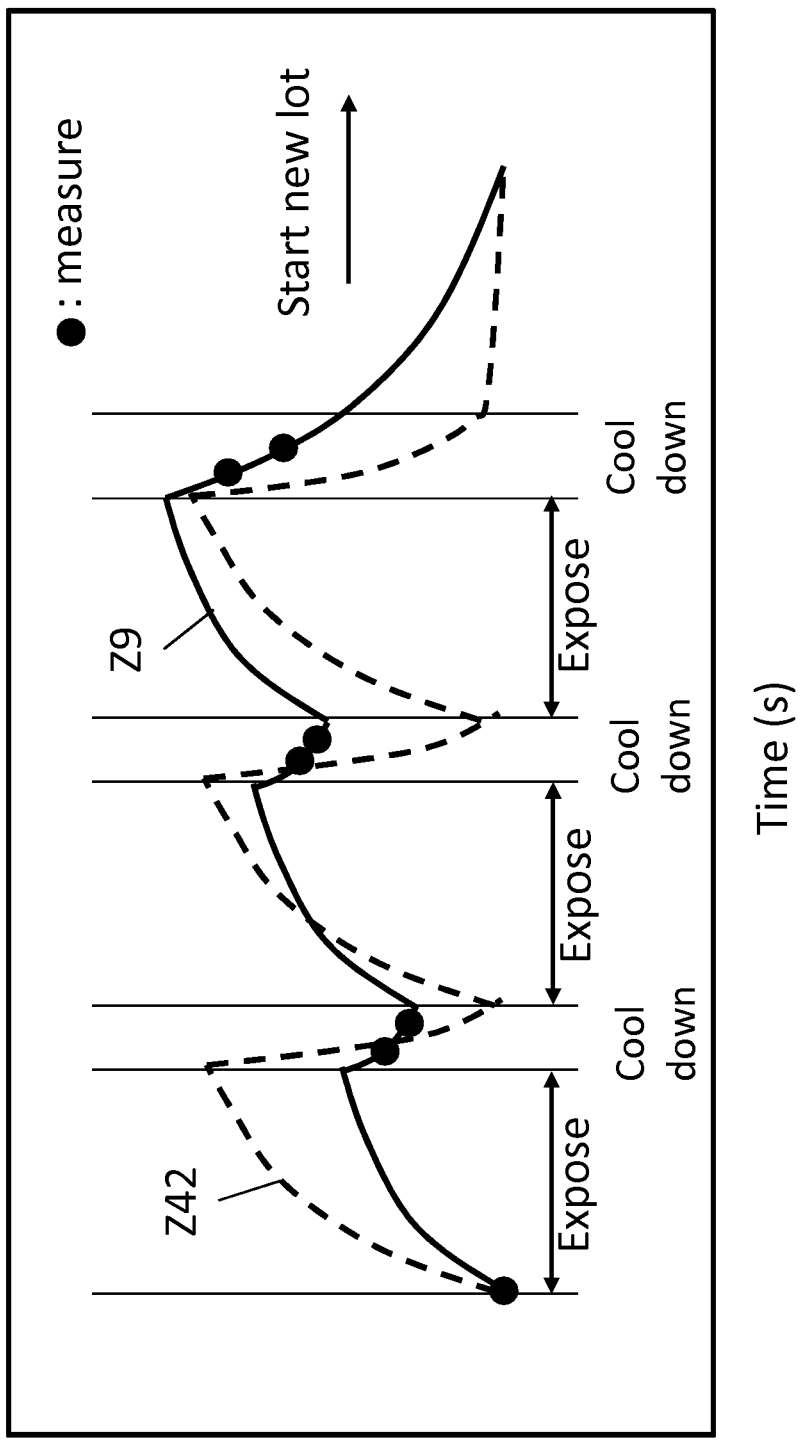
FIG. 5 depicts a diagram of Zernike polynomial amplitudes as a function of time during exposure and cool down periods.

A person skilled in the art may acknowledge that projection system PS heating effects may be considered as a result of fast and slow contributors. For example, FIG. 5 depicts the heating amplitude in terms of Zernike polynomials. Zernike polynomial $Z_{42}$ is considered to represent the fast projection system PS heating behaviour, whereas Zernike polynomial $Z_9$ may represent the relatively slow heating behaviour. As illustrated, by way of example, the amplitude of Zernike polynomial $Z_9$ increases slowly during exposure of a substrate, and decreases slowly during the cool down period after the exposure has taken place. At the start of the next exposure, or even the next wafer lot, the cool down effect of the preceding exposure may be still noticeable. To minimize the impact for successive exposures, it is needed to predict the (remaining) drift of the slow components during the successive exposure. In order to make a prediction of the slow contributors or representatives, as illustrated by Zernike $Z_9$, the drift needs to be measured and calibrated at maximum NA, which may differ from the size of the NA as used during the preceding exposure.

On the other hand, fast heating effects (for example represented by Zernike $Z_{42}$) increase and decrease fast during the exposure and cool down period, respectively. During a successive wafer lot, these fast heating effects may have no significant impact. This may mean that prediction of the fast projection system PS heating behaviour beyond the current wafer lot is not needed. In addition, measurements and calibration of fast projection system PS heating behaviour at maximum NA is not required.

Figure 6:
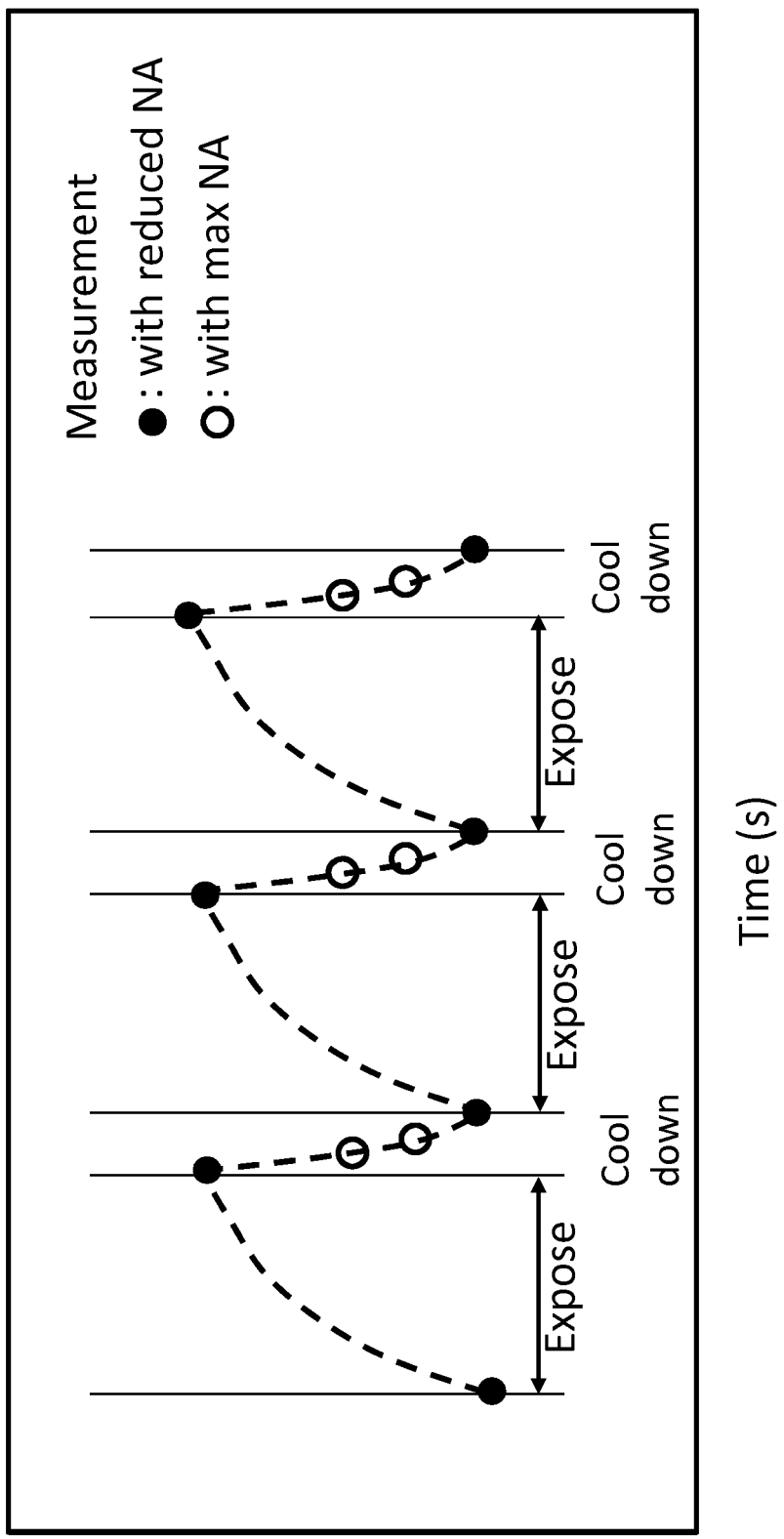
FIG. 6 depicts a diagram of Zernike amplitude as a function of time, including measurement series according to an embodiment of the invention.

FIG. 6 illustrates two types of measurements that are combined. A measurement apparatus, for example sensor S, is used to obtain the projection system PS heating data. In this embodiment of the invention, measurement of the fast and slow projection system PS heating behaviour is obtained by a first and a second measurement series. The first measurements series comprises at least two measurements: a measurement executed immediately before and a measurement immediately after exposure of the wafer. This is illustrated by the solid dots. Advantage of this measurements series, is that no NA size change, with respect to the NA size as used during exposure, is needed. Therefore, the measurement may be done without much time delay (NA switching can be time consuming). This means that these measurements are suitable for calibrating fast projection system PS heating behaviours. The second measurement series comprises at least two measurements that are executed between successive measurements with reduced NA, typically during the cool down period. This second measurement series is required to determine the slow drifting Zernike polynomials, for which a maximum NA is required. This means that the size of the NA as used for the exposure is maintained for the measurements of the first measurement series and is successively set to maximum for the measurements of the second measurements series in order to obtain information of fast and slow lens heating components. In case a next exposure is scheduled, the NA is changed back to the NA that is required for the next exposure.

Calibration of the projection system PS heating behaviour may be performed directly after a production lot. However, the projection system PS typically needs to be cooled down (pre-cooling) before the calibration can start. This results in a significant loss in availability of the lithographic apparatus LA. In addition, cooling down of the projection system PS after the calibration sequence (post-cooling) may also be required to avoid impact on the exposures of the successive production lot. The inventors have recognized that the calibration of the projection system PS heating behaviour may be done in between successive production lots with minimal impact on the availability of the lithographic apparatus LA by means of a exposure sequence with various energy dose, as illustrated by FIG. 7.

Figure 7:
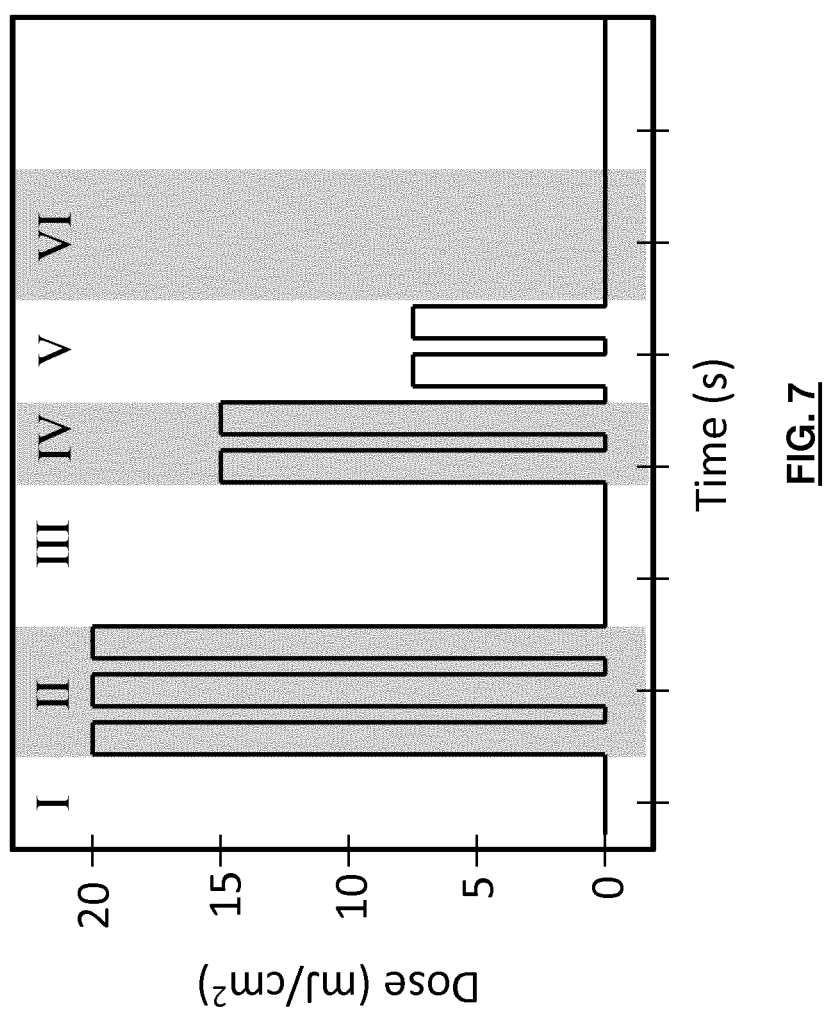
FIG. 7 depicts an illustration of energy dose modulation according an embodiment of the invention.

FIG. 7 illustrates a method of calibrating a projection system PS heating model in order to predict the (transient) aberration behaviour of the projection system PS in a lithographic apparatus LA, according to an embodiment of the invention. The method comprises an exposure sequence that may be carried out directly after a production lot. The exposure sequence, as is illustrated by FIG. 7, may comprise a series of exposure sets. The exposure sets may differ to each other in terms of energy dose as well as number of exposures within each exposure set. The exposure sequence may, for example, comprise six exposure sets (indicated by I to VI) that include in total fifteen exposures. In the exemplary exposure sequence, as illustrated by FIG. 7, comprises; a first exposure set comprising two exposures with zero dose, a second exposure set comprising three exposures with an energy dose of 20 mJ/cm$^2$, a third exposure set comprising three exposures with zero dose, a fourth exposure set comprising two exposures with an energy dose of 15 mJ/cm$^2$, a fifth exposure set comprising two exposures with an energy dose of 7.5 mJ/cm$^2$, and a sixth exposure set comprising three exposures with zero dose. Upfront and after each exposure the aberration is measured, for example by means of sensor S. By modulating the energy dose, a correlation between the energy dose (input signal) and the measured aberration (output signal), in terms of Zernike polynomials, may be obtained. By modulation of the heat load on the projection system PS, by means of the exposures of various energy dose, the projection system PS is persistently excited. This will allow the projection system PS to respond with high frequency. High frequency signals are the result of short time constants that are of interest for the calibration.

The number of exposure sets may be more than six or may be less than six, depending on the required accuracy and or the actual exposures within each exposure set. In addition, the number exposures per exposure set is not limited to two or three exposures. That is, more or less exposures may be used per exposure set.

The energy dose of each exposure set is not limited to the numbers disclosed in FIG. 7 and the above description.

The energy dose of successive non-zero exposure sets may be descending. This may have the advantage that the heat residual after the last non-zero exposure is kept to a minimum. It is noted that the energy dose of successive non-zero exposure sets may also be ascending. An arbitrary dose sequence may be used, as long as the correlation between the input signal and the output signal can be determined.

The method of calibrating a projection system PS heating behaviour comprising a exposure sequence, as described above, may be performed with a projection system PS set to maximum NA and or set to a reduced NA. The reduced NA setting of the projection system PS may be similar as the size of the NA that is used for exposures during a production lot.

The size of the NA of the projection system PS, as used for a preceding exposure, may be maintained during the exposure sequence that is used for the calibration. This may minimize the overhead time required for the calibration executed between two production lots.

The size of the NA of the projection system PS main be changed (switched) before or during the exposure sequence that is used for the calibration. The size of the NA may be within the range (and including) defined by the NA as used during exposures of the production lot and the maximum NA. Depending on the heating behaviour of interest, the size of the NA is defined and set (switched).

After the calibration data is gathered, next step is to separate the heating response of the calibration exposure sequence from the cooling down effect of the production lot that is exposed just before the start of the exposure sequence. To do so, a projection system PS heating model will be calibrated on reticle align data of the production lot. This model may be used to estimate the cool down effect of the production lot during the calibration exposure sequence.

Using the measurement procedure and calibration method of embodiments of the invention enables the accuracy of the projection system PS heating model to be improved. The new calibration strategy, with its high-frequency of data gathering, may, for the same experiment duration, provide a more complete data set than the previous measurement scheme in which timing was determined by the production sequence. Thus, for the same accuracy of calibrated projection system PS heating behaviour, the new calibration strategy may be quicker. This can lead to a significant (e.g., greater than 90%) reduction of the calibration time of the projection system PS heating model, per application, per lithographic apparatus LA. This may improve availability of the lithographic apparatus LA and cycle time of the substrates during production. The availability improvement comes from having a shorter calibration experiment.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the clauses set out below. Other aspects of the invention are set out as in the following numbered clauses:

1. A method of calibrating a projection system heating model to predict an aberration in a projection system in a lithographic apparatus, the method comprising:

passing exposure radiation through a projection system to expose one or more exposure fields on a substrate provided on a substrate table; and making measurements of the aberration in the projection system caused by the exposure radiation;

wherein the time period between the measurements is less than the time period that would be taken to expose all exposure fields on the substrate.

2. The method of clause 1, wherein the time period between successive measurements of the aberration is 10 seconds or less.

3. The method of any preceding clause, further comprising measuring the aberration prior to the substrate being exposed in the lithographic apparatus.

4. The method of any preceding clause, further comprising:
measuring the aberration associated with the exposure of the exposure field;
passing exposure radiation through the projection system to expose another exposure field of the substrate; and
measuring the aberration associated with the exposure of the another exposure field.

5. The method of clause 4, further comprising measuring the aberration at least once for each of a plurality of exposures of different exposure fields of the substrate on the substrate table.

6. The method of any preceding clause, further comprising measuring the aberration with the substrate located on the substrate table during a cooling down phase with no exposure radiation passing through the projection system.

7. The method of clause 6, further comprising measuring the aberration a plurality of times during the cooling phase.

8. The method of clause 7, wherein the time period between successive measurements of the aberrations during the cooling phase is less than the time period between successive measurements of the aberrations during exposure of the substrate.

9. The method of any preceding clause, further comprising measuring the aberration prior to passing the exposure radiation through the projection system and measuring the aberration after passing the exposure radiation through the projection system.

10. The method of any preceding clause, further comprising maintaining the size of the numerical aperture for the projection system between measurements of the aberration during exposure of the substrate.

11. The method of any preceding clause, further comprising maintaining the size of the numerical aperture for the projection system at less than the full numerical aperture during the exposure of the substrate and the cooling phase.

12. The method of any preceding clause, further comprising measuring the aberration associated with the exposure of a plurality of substrates on a plurality of substrate tables.

13. The method of any preceding clause, further comprising providing temporal modulation of a source producing the radiation beam.

14. The method of any preceding clause, further comprising providing amplitude modulation of a source producing the radiation beam.

15. A measurement apparatus configured to make measurements for calibrating a projection system heating model to predict an aberration in a projection system in a lithographic apparatus;
wherein the measurement apparatus is configured to make measurements of the aberration in a projection system caused by exposure radiation being passed through the projection system to expose one or more exposure fields on a substrate on a substrate table; and
wherein the measurement apparatus is configured to make the measurements in a time period that is less than the time period that would be taken to expose all exposure fields on the substrate.

16. The measurement apparatus of clause 15, wherein the time period between successive measurements of the aberrations is 10 seconds or less.

17. The measurement apparatus of clauses 15 or 16, wherein the measurement apparatus is configured to measure the aberration prior to the substrate being exposed in the lithographic apparatus.

18. The measurement apparatus of clauses 15 to 17, wherein the measurement apparatus is configured to measure the aberration associated with the exposure of the exposure field, and then measure the aberration associated with the exposure of another exposure field of the substrate after exposure radiation has passed through the projection system to expose the another exposure field of the substrate.

19. The measurement apparatus of clause 18, wherein the measurement apparatus is configured to measure the aberration at least once for each of a plurality of exposures of different exposure fields of the substrate on the substrate table.

20. The measurement apparatus of clauses 15 to 18, wherein the measurement apparatus is configured to measure the aberration with the substrate located on the substrate table during a cooling down phase with no exposure radiation passing through the projection system.

21. The measurement apparatus of clause 20, wherein the measurement apparatus is configured to measure the aberration a plurality of times during the cooling phase with the substrate.

22. The measurement apparatus of clause 21, wherein the time period between successive measurements of the aberrations during the cooling phase is less than the time period between successive measurements of the aberrations during exposure of the substrate.

23. The measurement apparatus of clauses 15 to 22, wherein the measurement apparatus is configured to measure the aberration prior to the exposure radiation being passed through the projection system and measure the aberration after the exposure radiation has been passed through the projection system.

24. The measurement apparatus of clauses 15 to 23, wherein the measurement apparatus is configured to measure the aberration associated with the exposure of a plurality of substrates on a plurality of substrate tables.

25. The measurement apparatus of any preceding clause, wherein the radiation is amplitude modulated.

26. The measurement apparatus of any preceding clause, wherein the radiation is temporal modulated.

27. A lithographic apparatus comprising a projection system configured to project a pattern from a mask onto a substrate, the lithographic apparatus further comprising the measurement apparatus according to clauses 15 to 24.

28. The lithographic apparatus of clause 27, wherein the size of the numerical aperture for the projection system is maintained between measurements of the aberration during exposure of the substrate.

29. The lithographic apparatus of clause 27 or 28, wherein the size of the numerical aperture for the projection system is maintained at less than the full numerical aperture during the exposure of the substrate and the cooling phase.

30. A computer program comprising computer readable instructions configured to cause a processor to carry out a method according to any one of clauses 1 to 14.

31. A computer readable medium carrying a computer program according to clause 30.

32. A computer apparatus for calibrating a projection system heating model to predict an aberration in a projection system in a lithographic apparatus comprising:
a memory storing processor readable instructions; and
a processor arranged to read and execute instructions stored in said memory;

wherein said processor readable instructions comprise instructions arranged to control the computer to carry out a method according to any one of clauses 1 to 14.

The invention claimed is:

1. A method comprising:
 passing exposure radiation through a projection system to expose one or more exposure fields on a substrate provided on a substrate table; and
 making first and second measurements of an aberration in the projection system;
 wherein a time period between the first and second aberration measurements is less than a time period that would be taken to expose all of the one or more exposure fields on the substrate.

2. The method of claim 1, further comprising measuring the aberration prior to the exposure of the substrate in a lithographic apparatus.

3. The method of claim 1, further comprising:
 measuring the aberration associated with exposure of the one or more exposure fields;
 passing exposure radiation through the projection system to expose another of the one or more exposure fields of the substrate; and
 measuring the aberration associated with the exposure of the another of the one or more exposure fields.

4. The method of claim 1, further comprising measuring the aberration at least once for each of a plurality of exposures of different ones of the one or more exposure fields of the substrate.

5. The method of claim 1, further comprising measuring the aberration with the substrate located on the substrate table during a cooling down phase with no exposure radiation passing through the projection system.

6. The method claim 1, further comprising:
 measuring the aberration prior to passing exposure radiation through the projection system, and
 measuring the aberration after passing the exposure radiation through the projection system.

7. The method of claim 1, further comprising maintaining a size of a numerical aperture for the projection system during the first and second aberration measurements at a size used for exposing the substrate.

8. The method of claim 1, further comprising maintaining a size of a numerical aperture for the projection system at less than a full numerical aperture during the exposure of the substrate and a cooling phase.

9. The method of claim 1, further comprising measuring the aberration associated with the exposure of a plurality of the substrates on a plurality of the substrate tables.

10. The method of claim 1, further comprising providing temporal modulation of a source producing the radiation beam.

11. The method of claim 1, further comprising providing amplitude modulation of a source producing the radiation beam.

12. The method of claim 1, further providing exposure radiation according to an exposure sequence of multiple exposure sets, with each exposure set having at least one of:
 a different energy dose to another, and
 a different number of exposures.

13. The method of claim 1, further comprising measuring the aberration in the projection system by:
 measuring at least once the aberration at a numerical aperture (NA) size used for exposing the substrate,
 measuring at least twice the aberration at maximum NA, and
 measuring at least once the aberration at the NA size used for exposing the substrate.

14. A measurement apparatus configured to carry out a method of claim 1.

15. A lithographic apparatus comprising:
 a projection system configured to project a pattern from a mask onto a substrate; and
 a measurement apparatus configured to:
  pass exposure radiation through a projection system to expose one or more exposure fields on a substrate provided on a substrate table; and
  make first and second measurements of an aberration in the projection system;
  wherein a time period between the first and second aberration measurements is less than a time period that would be taken to expose all of the one or more exposure fields on the substrate.

* * * * *